United States Patent [19]

Morimoto

[11] Patent Number: 4,490,698
[45] Date of Patent: Dec. 25, 1984

[54] SURFACE ACOUSTIC WAVE BANDPASS FILTER

[75] Inventor: Mikio Morimoto, Tokyo, Japan

[73] Assignee: Nippon Electric Co., Ltd., Tokyo, Japan

[21] Appl. No.: 460,581

[22] Filed: Jan. 24, 1983

[30] Foreign Application Priority Data

Jan. 26, 1982 [JP] Japan .................................. 57-10305

[51] Int. Cl.³ .......................... H03H 9/64; H03H 9/25
[52] U.S. Cl. .................................. 333/193; 310/313 B; 333/196
[58] Field of Search ....................... 333/150–155, 333/193–196; 310/313 R, 313 B, 313 C, 313 D; 364/821; 330/5.5; 331/107 A

[56] References Cited

U.S. PATENT DOCUMENTS 3,446,975  5/1969  Adler et al. ....................... 33/193 X
3,582,840  6/1971  DeVries ............................. 333/193

OTHER PUBLICATIONS

A "Far Proximity" Photolithographic Process For Semiconductor Manufacture; Proceedings Eastman Kodak Co. Oct. 19–21, 1975, Monterey, California.
SAW Difraction Analyses by Paired Echo Superposition (IEEE vol. SU-23 No. 4, Jul. 4, 1976).

Primary Examiner—Marvin L. Nussbaum
Attorney, Agent, or Firm—Laff, Whitesel, Conte & Saret

[57] ABSTRACT

A surface acoustic wave bandpass filter has a piezoelectric substrate for propagating a surface acoustic wave. An input transducer is formed on the substrate, with a pair of interdigital electrodes, for exciting a surface acoustic wave in response to an electrical signal. An output transducer is also formed on the substrate, with essentially the same structure for developing a filtered electrical signal from the surface acoustic wave propagated in the substrate. The input and output transducers are arranged so that the distance between them (L) satisfies the relationship: $\lambda/2\, n < L < \lambda/2\, (n+1)$ (n is a positive integer), and $\lambda/2$ represents the distance between the centers of adjacent electrode fingers.

7 Claims, 2 Drawing Figures

U.S. Patent  Dec. 25, 1984  4,490,698
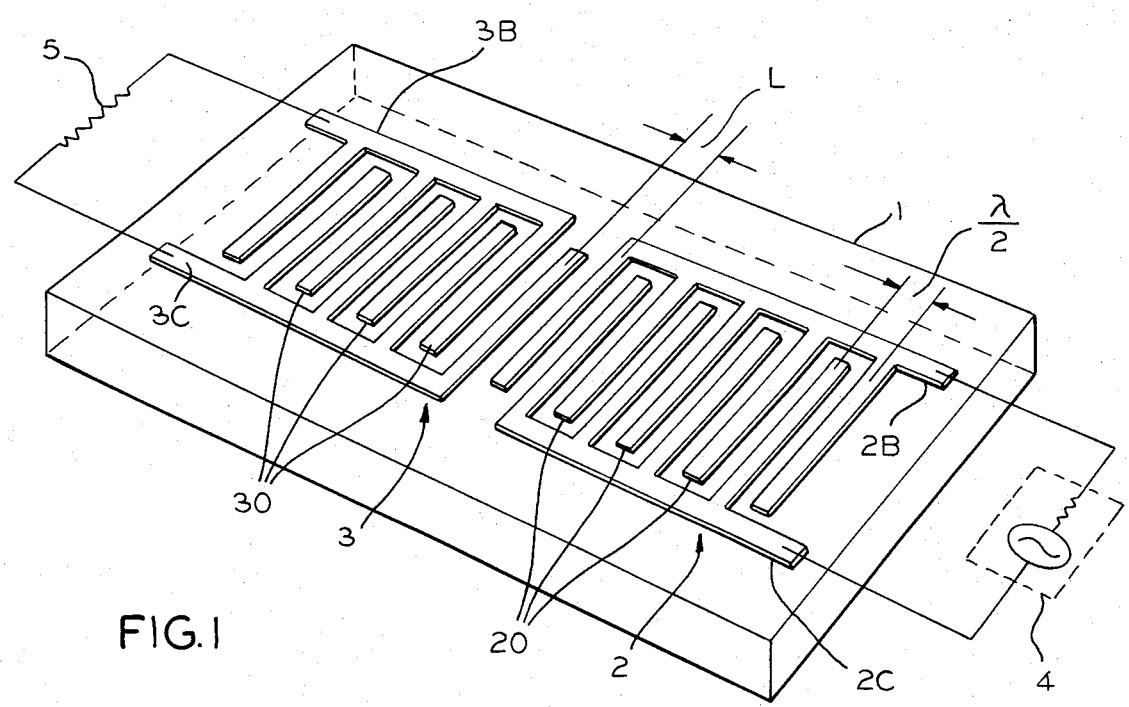
FIG.1
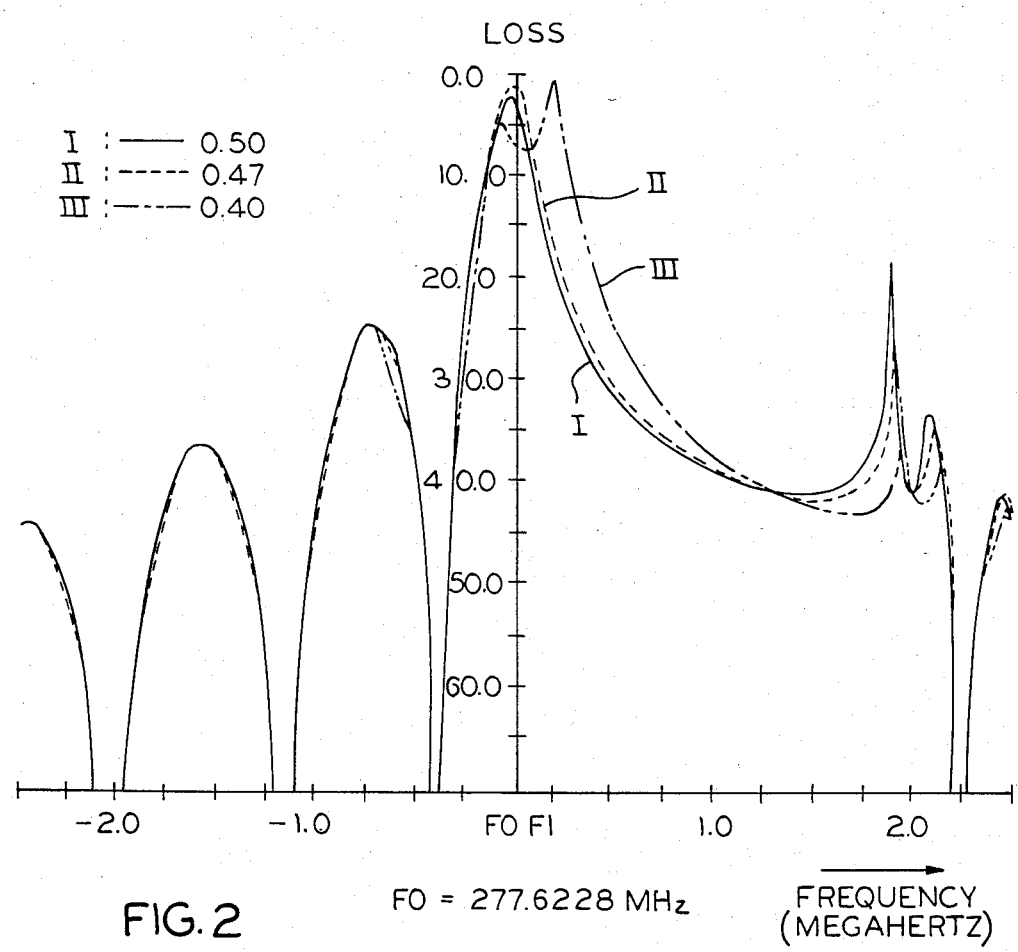
FIG.2   FO = 277.6228 MHz   FREQUENCY (MEGAHERTZ)

SURFACE ACOUSTIC WAVE BANDPASS FILTER

The present invention relates to a surface acoustic wave (SAW) device and, more particularly, to an improved SAW bandpass filter.

In recent years, SAW devices have been finding increasingly broader practical applications such as filters and delay lines.

Particularly, SAW devices find use in bandpass filters because there are size and cost advantages which lead to replacing conventional LC bandpass filters. A typical example of such a SAW bandpass filter is described in a paper by Rober S. Wagers entitled "SAW Diffraction Analysis by Paired Echo Superposition" published in the IEE TRANSACTIONS ON SONICS AND ULTRASONICS, Vol. SU-23, No. 4 (June 1976), pp. 249-254. The filter described therein has a piezoelectric substrate with interdigital input and output transducers formed on the substrate. However, it involves a comparatively high degree of insertion loss since the distance between the input and output transducers is set at an integral multiple ($35\lambda$) of one half of the electrode finger spacing $\lambda$.

An object of the present invention is, therefore, to provide a SAW bandpass filter which is operable with a smaller insertion loss and which is free from the above-mentioned disadvantage in the prior art SAW bandpass filter.

According to one aspect of the invention, a surface acoustic wave bandpass filter comprises:

a piezoelectric substrate for propagating a surface acoustic wave;

input transducer means formed on the substrate and having a pair of interdigital electrodes, each electrode including a plurality of electrode fingers for exciting a surface acoustic wave in response to an electrical signal applied thereto; and output transducer means formed on the substrate and having substantially the same structure as the input transducer means has, for developing a surface acoustic wave which is propagated in the substrate into a filtered electrical signal, the input and output transducer means being arranged so that the distance L therebetween satisfies $\lambda/2 < L < \lambda/2(n+1)$, where (n is a positive integer), and where $\lambda/2$ represents the pitch between the centers of adjacent electrode fingers.

Other features and advantages of the invention will be described in detail hereunder, taken in conjunction with the accompanying drawings, wherein:

FIG. 1 shows a perspective view of one embodiment of the invention; and

FIG. 2 shows filtering characteristics achieved by the embodiment.

Referring to FIG. 1, the embodiment includes a piezoelectric substrate 1 consisting of a quartz plate for propagating a surface acoustic wave, and aluminum input and output transducers 2 and 3 which are formed on the substrate by a photolithographic technique. Each of the transducers 2, 3 comprises a pair of interdigital electrodes 2B and 2C (3B and 3C) having a plurality of electrode fingers 2A (3A). The transducers 2 and 3 are arranged so that the distance L therebetween satisfies $\lambda/2n < L < \lambda/2(n+1)$, where (n is a positive integer), and where $\lambda/2$ represents the pitch between the centers of adjacent electrode fingers 20 (30). Reference numerals 4 and 5 respectively represent a signal generator and a terminal resistor.

For details of the above-mentioned photolithographic technique, reference is made to a paper entitled "A Far-Proximity Photolithographic Process for Semiconductor Manufacture", published in the Proceedings INTER FACE '75, of the Kodak Microelectronics Seminar, held in Monterey, Cal., from Oct. 19 through 21, 1975.

In operation, the input transducer 2 excites a surface acoustical wave in the substrate 1, in response to an electrical signal given thereto. The transducer 3 develops the excited surface acoustical wave into a filtered electrical signal.

Referring to FIG. 2, the embodiment achieves filter characteristics I to III if the distance L between the transducers 2 and 3 is varied as $0.4\lambda$, $0.47\lambda$, and $0.5\lambda$ with the following dimensional and material limitations: The substrate 1 is made of quartz; each of the electrodes 2B, 2C, 3B, and 3C is made of aluminum having a thickness of pairs of 2500 angstroms; the number of the electrode fingers is 300; the pitch $\lambda/2$ is 11.23 microns; and the resonance frequency FO of the transducer 2 or 3 is 277.6228 megahertz (MHz).

As shown in the characteristic curve II ($L=0.47\lambda$), the present embodiment involves an insertion loss of 1.15 dB, at the resonance frequency FO. This loss is far smaller than 2.5 dB, the figure for the conventional filter ($L=0.5\lambda$) of Reference 1. The characteristic curve III shows a greater insertion loss at the resonance frequency F0 (277.6228 MHz) than the loss shown in the characteristic I, but it also shows the least insertion loss at a frequency F1 (277.8628 MHz), which is higher than the frequency FO. This means that the present invention can operate with the least insertion loss by frequency-shifting the characteristic curve III so that the frequency F1 may be shifted to FO. Such a frequency-shift operation may be easily achieved by changing the above-defined pitch $\lambda/2$ on the basis of the equation described in Column 1, line 64 of the U.S. Pat. No. 4,160,219.

If there are 300 pairs of electrodes fingers constituting the transducers 2 and 3, the following Table 1 shows the comparison between the insertion loss caused when L is in the range of $\lambda/2\, n < L < \lambda/2\, (n+1)$ and loss caused when L is $\lambda/2\, n$ (as set in the above-mentioned conventional filter). As the Table 1 clearly shows, the present embodiment can operate with less insertion loss, in each case.

TABLE 1

| n | 2 | 4 | 10 | 20 |
|---|---|---|---|---|
| $L = \frac{\lambda}{2} n$ | $\lambda$ | $2\lambda$ | $5\lambda$ | $10\lambda$ |
| Loss (dB) | 2.15 | 1.80 | 1.10 | 0.60 |
| $\frac{\lambda}{2} n < L < \frac{\lambda}{2} (n + 1)$ | $0.98\lambda$ | $1.98\lambda$ | $4.99\lambda$ | $9.99\lambda$ |
| Loss (dB) | 1.50 | 1.25 | 0.95 | 0.50 |

In this way, the present invention can provide a SAW bandpass filter which is operable with less insertion loss, by setting the distance L between the input and output transducers in the range of $\lambda/2\, n < L < \lambda 2\, (n+1)$.

What is claimed is:

1. A surface acoustic wave bandpass filter comprising:

a piezoelectric substrate for propagating a surface acoustic wave;

input transducer means formed on the substrate and having a pair of interdigital electrodes including a plurality of interdigitated electrode fingers for exciting a surface acoustic wave in response to an electrical signal applied thereto; and output transducer means formed on said substrate and having a structure which is substantially the same as the structure of said input transducer means for developing said surface acoustic wave propagated in said substrate into a filtered electrical signal, said input and output transducer means being separated by a distance L which satisfies the relationship where $\lambda/2\, n < L < \lambda/2\, (n+1)$, where n is a positive integer and where $\lambda/2$ represents the distance between the centers of adjacent electrode fingers.

2. The filter of claim 1 wherein said electrodes are made of aluminum, having a thickness the order of 2500 Angstroms.

3. The filter of claim 1 wherein the distance between the centers of adjacent interdigital electrodes is in the order of 11.23 microns.

4. The filter of claim 1 wherein each of the transducer means is resonant at the frequency of approximately 277 to 278 megahertz.

5. The filter of claim 1 wherein each of the transducer means is resonant at approximately 277.6228 MHz.

6. The filter of claim 1 wherein there are 300 pairs of said finger electrodes.

7. The filter of claim 1 wherein there are 300 pairs of said electrode fingers made of aluminum and having a thickness the order of 2500 Angstroms; said each of electrode fingers being separated from its adjacent fingers by a distance in the order of 11.23 microns measured between the centers of adjacent interdigital electrode fingers, wherein each of the transducer means is resonant at the frequency of approximately 277 to 278 megahertz.

* * * * *